United States Patent [19]

Malecek et al.

[11] Patent Number: 5,295,255
[45] Date of Patent: Mar. 15, 1994

[54] METHOD AND APPARATUS FOR PROGRAMMING A SOLID STATE PROCESSOR WITH OVERLEAVED ARRAY MEMORY MODULES

[75] Inventors: Kenneth A. Malecek, Willoughby Hills; Timothy F. Powell, Mentor; Jeffrey A. Dobos, Cleveland, all of Ohio

[73] Assignee: Electronic Professional Services, Inc., Cleveland, Ohio

[21] Appl. No.: 661,049

[22] Filed: Feb. 22, 1991

[51] Int. Cl.$^5$ .............................................. G06F 12/06
[52] U.S. Cl. ........................ 395/425; 364/DIG. 1; 364/243
[58] Field of Search ... 364/200 MS File, 900 MS File; 395/425

[56] References Cited

U.S. PATENT DOCUMENTS

| | | | |
|---|---|---|---|
| 3,638,199 | 1/1972 | Kolankowsky et al. | 395/425 |
| 3,872,452 | 3/1975 | Stoops | 307/463 |
| 4,432,055 | 2/1984 | Salas et al. | 395/400 |
| 4,507,730 | 3/1985 | Johnson et al. | 395/425 |
| 4,630,230 | 12/1986 | Sundet | 364/405 |
| 4,685,088 | 8/1987 | Iannucci | 365/189.02 |
| 4,750,158 | 6/1988 | Giebel et al. | 365/200 |
| 4,752,915 | 6/1988 | Suzuki et al. | 365/230.03 |
| 4,811,294 | 3/1989 | Kobayashi et al. | 365/189.05 |
| 4,827,452 | 5/1989 | Toyama et al. | 365/200 |
| 4,849,938 | 7/1989 | Furutani et al. | 371/10.3 |
| 4,888,773 | 12/1989 | Arlington et al. | 371/40.2 |
| 4,907,203 | 3/1990 | Wada et al. | 365/238.5 |
| 4,924,375 | 5/1990 | Fung et al. | 395/425 |
| 4,926,385 | 5/1990 | Fujishima et al. | 365/230.03 |
| 4,975,883 | 12/1990 | Baker et al. | 365/226 |
| 4,984,212 | 1/1991 | Fukuda et al. | 365/230.03 |
| 4,992,979 | 2/1991 | Aichelmann, Jr. et al. | 395/425 |
| 5,053,990 | 10/1991 | Kreifels et al. | 395/425 |
| 5,097,446 | 3/1992 | Shoji et al. | 365/195 |
| 5,128,897 | 7/1992 | McClure | 365/230.06 |
| 5,134,589 | 7/1992 | Hamano | 365/238.5 |
| 5,150,328 | 9/1992 | Aichelmann, Jr. | 365/189.03 |
| 5,172,338 | 12/1992 | Mehrotra et al. | 365/185 |
| 5,200,959 | 4/1993 | Gross et al. | 371/21.6 |
| 5,214,605 | 5/1993 | Lim et al. | 365/218 |
| 5,218,569 | 6/1993 | Banks | 365/189.01 |

OTHER PUBLICATIONS

Mano, computer system acrhitecture, 2nd edition, 1982, pp. 272-284.
Intel Specification Sheet 28F010 for CMOS Flash Memory (1989).
Intel application Note AP-343 (Oct. 1990).

*Primary Examiner*—Joseph L. Dixon
*Assistant Examiner*—Matthew Kim
*Attorney, Agent, or Firm*—Tarolli, Sundheim & Covell

[57] ABSTRACT

A method and apparatus for programming a mass storage device of the type having a plurality of memory word locations. The memory word locations are organized into a plurality of addressable columns and addressable rows, each memory word location capable of storing one byte word in response to at least two programming steps. Each programming step for a selected memory word location requires a predetermined time period before a subsequent programming step can be processed by the selected memory word location. A first programming step is applied to a first memory word location. The first programming step is applied sequentially to other memory word locations while the first programming step is being processed by the first memory word location. A second programming step is applied to the first memory word location while the first programming step is being process by the other memory word locations. The second programming step is sequentially applied to the other memory word locations while the second programming step is being processed by the first memory word location. Also disclosed is a method of erasing such memory and a method for storing and processing bad address locations.

15 Claims, 14 Drawing Sheets

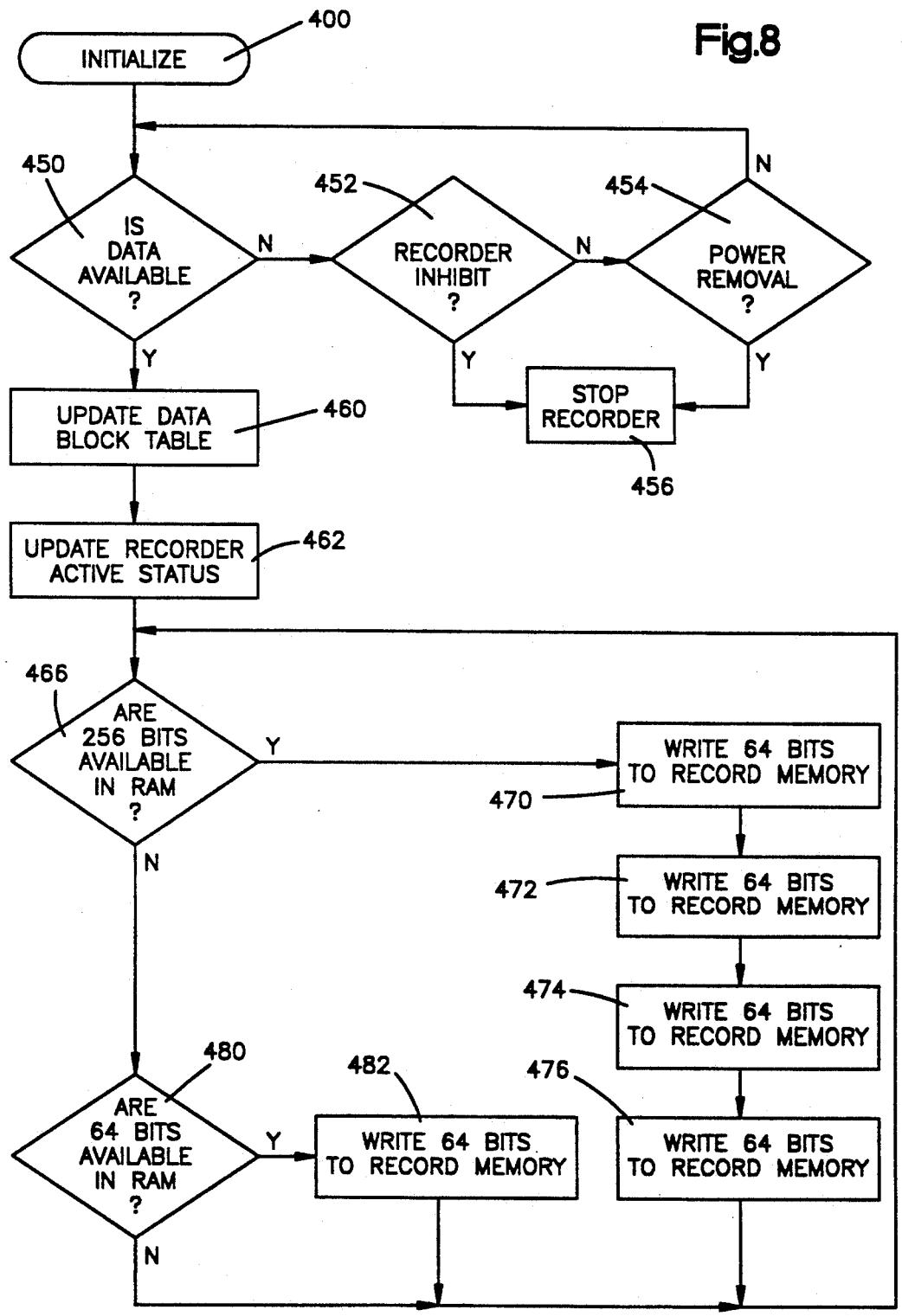

METHOD AND APPARATUS FOR PROGRAMMING A SOLID STATE PROCESSOR WITH OVERLEAVED ARRAY MEMORY MODULES

GOVERNMENT RIGHTS

This invention was made with support of the United States Government and the Government has certain rights in the invention.

TECHNICAL BACKGROUND OF THE INVENTION

The present invention is directed to mass data storage devices and is particularly directed to a method and apparatus for programming a solid state recorder.

BACKGROUND ART

Recorders for mass storage and retrieval of data are known in the art. Such devices typically include a controller, an interface and a recording medium. The interface is unique to the particular data source device to which the recorder is to be connected. The controller controls the flow of data in an d out of the recorder. The controller further controls how and where data is stored in or on the recording medium. In known prior art devices, the recording medium has typically been magnetic tape.

One example of such a magnetic tape recording device is used in aircraft to record aircraft operating information. Such devices are known as "black boxes." After a crash of an aircraft having such a "black box," data is extracted from the recorder so that an analysis can be made of the aircraft's operation prior to the crash. From this data, the cause of the crash is, hopefully, determined.

Mass storage devices are also used in guided missiles or electronically controlled torpedoes An electronically controlled torpedo absent an exploding warhead, for example, is test fired from a ship with a data recorder running. The recorder monitors data lines having electric signals thereon indicative of the operation of the torpedo during the test run After the test run is completed, the recorder is removed and data indicative of the operation of the torpedo is extracted for analysis by appropriate personnel.

Magnetic tape recording devices have several drawbacks. Such recorders, are subject to an extremely harsh environment including large shocks and vibration To make such devices relatively shock and vibration proof, expensive mounting arrangements have been made. Also, if a magnetic tape recorder fails, e.g., the tape stops due to a failure of the tape drive motor, data occurring subsequent to the failure is lost.

Many of the draw-backs with magnetic tape recording devices has been overcome by development of a recording medium referred to as solid state memory devices. A particular type of solid state recording device that does not require electrical power for retention of recorded data is referred to in the art as nonvolatile memories Such memories include erasable programmable read only memories ("EPROMs") and electrically erasable programmable read only memories ("EEPROMs"). Both EPROMs and EEPROMs are less sensitive to shock and vibration than magnetic tape recording devices. Also, it is possible to provide extra memory in an array so that if a memory location is sensed to be bad, the extra memory is substituted This provides a simple redundant memory.

EPROMs require ultraviolet light for erasure EEPROMs are relatively expensive. Therefore, EPROMs and EEPROMs are rarely used in a mass storage device Also, read/write/erase times required for proper operation of such for EPROMs and EEPROMs is relatively long therefore making them undesirable for use in a mass storage device requiring a high resolution of data It is essential that the rate of recording, i.e., bits per second, be greater than the rate at which changes in data occurs Otherwise, data necessary for a proper analysis of the operation of the data source could be lost because the record is not fast enough.

A recent innovation in the art of solid state, nonvolatile memories has been the development of "flash memories." Such a flash memory is manufactured by and is available through Intel Corporation, of Santa Clara, Calif., under their Part No. 28F010.

Such flash memory has unique programming requirements including a necessity for providing an address, providing a set-up program command, writing data to the memory, sending a write verifying command to the memory, performing the verification operation, and then updating the address pointer. This process for programming takes a substantial amount of time due to the fact that the manufacturer requires certain minimum time periods for the accomplishment of processing steps. For example, it takes 120 nanoseconds for a set-up program command, 120 nanoseconds for writing the data to be programmed, 10 microseconds for programming the data, 120 nanoseconds for a read verify command, 6 microseconds for a read verify to occur, and 120 nanoseconds for a program verification.

It is desirable to have a solid state mass memory device using flash memory or similar device that would enable a faster reading/writing rate so as to improve the resolution of the memory.

SUMMARY OF THE INVENTION

The present invention provides a new and improved method and apparatus for mass storage of data of a type requiring more than one programming step for storage of data and further require a predetermined minimum time period and a predetermined maximum time period between programming steps. The present invention permits recording at a rate faster than the predetermined minimum time period.

The memory is divided into a plurality of rows and columns of addressable memory locations. The memory locations are addressed using the least significant bits of an address bus. A controller sequentially sends a programming step to several memory locations during the predetermined minimum time period after a first programming step was output to a first memory location. This substantially speeds up the storage capability of the mass storage device.

In accordance with one embodiment of the present invention, a method is provided for programming a mass storage device of the type having a plurality of memory word locations. The memory word locations are organized into a plurality of addressable columns and addressable rows, each memory word location capable of storing one word in response to at least two programming steps Each programming step for a selected memory word location requires a predetermined time period before a subsequent programming step can be processed by the selected memory word location.

The method comprises the steps of providing a first programming step to a first memory word location and providing the first programming step to another memory word location while the first programming step is being processed by the first memory word location. The method further comprises the step of providing a second programming step to the first memory word location while the first programming step is being process by the another memory word location The method further includes providing said second programming step to the another memory word location while the second programming step is being processed by the first memory word location.

An apparatus, in accordance with the present invention, for programming a mass storage device having a plurality of memory word locations The memory word locations are organized into a plurality of addressable columns and addressable rows Each such memory word location is capable of storing data in response to at least two programming steps. Each programming step for a selected memory word location requires a predetermined time period before a subsequent programming step can be processed by the selected memory word location The apparatus comprises element for providing a first programming step to a first memory word location. Elements are provided for applying the first programming step to another memory word location while the first programming step is being processed by said first memory word location. Element provides a second programming step to the first memory word location while the first programming step is being processed by the another memory word location. Elements are provided for applying the second programming step to the another memory word location while the second programming step is being processed by the first memory word location.

BRIEF DESCRIPTION OF THE DRAWINGS

The foregoing and other features of the present invention will become apparent to one skilled in the art upon a consideration of the following description of the invention with reference to the accompanying drawings, wherein:

FIG. 8 is a flow diagram showing a control process followed by the microcontroller of FIG. 1;

DESCRIPTION OF PREFERRED EMBODIMENT

Figure 1:
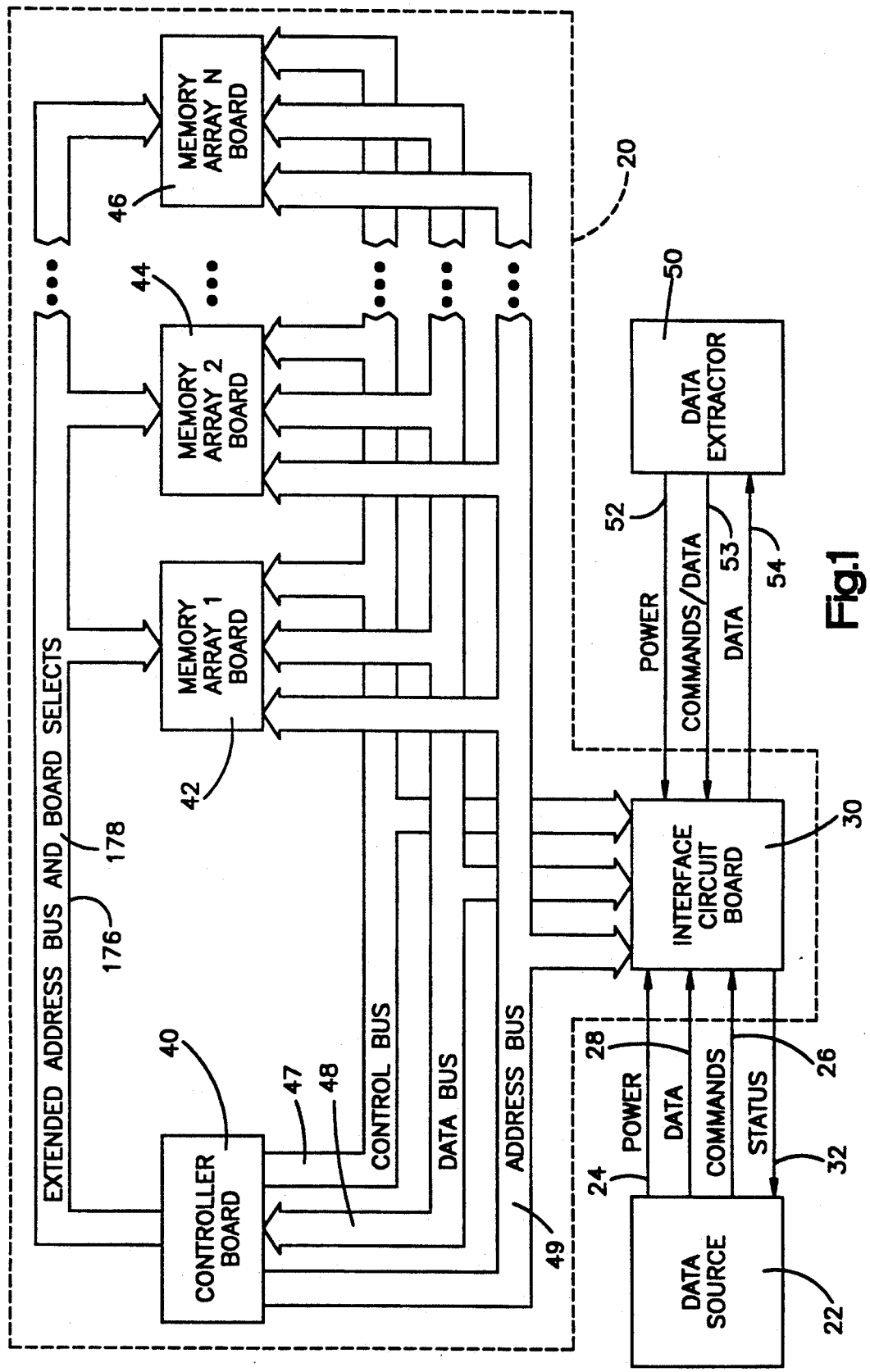
FIG. 1 is a schematic block diagram showing a mass storage device made in accordance with the present invention.

Referring to FIG. 1, a mass storage device 20 is connected to a data source 22. The data source 22 can be any of several known devices such as an electronic subsystem of a torpedo, an electronic subsystem of a guided missile, a test apparatus in a laboratory, a commercial aircraft, etc. The data source 22 provides operating power 24 for the mass storage device 20. It should be appreciated that the mass storage device 20 may have its own on-board power supply or have terminals for connection of an independent power supply.

The data source 22 preferably provides certain input signals for the mass storage device 20. Specifically, the data source 22 provides command output signals 26 and data output signals 28 connected to an interface circuit board 30 of the mass storage device 20. The interface circuit board 30 outputs status signals on line 32 to the data source 22.

The mass storage device 20 includes the interface circuit board 30, a controller board 40, and a plurality of memory boards 42, 44, 46. The interface board 30, the controller board 40, and each of the memory boards are connected together through a control bus 47, a data bus 48, and an address bus 49.

The memory board 46 is designated as memory array N board to indicated that any number of memory boards may be present in the mass storage device 20. The memory capacity of a mass storage device 20, made in accordance with the present invention, is unlimited. In a specific embodiment of a mass storage device, made in accordance with the present invention, the memory is typically limited to an amount required for proper recording of data from a known data source plus a predetermined amount of memory that functions as redundant memory plus a predetermined amount of overhead memory used to store tables for error handling Factors used to determine memory size include the bits per second provided by the data source times the time duration of recording.

The memory boards 42, 44, 46 each, preferably, include a plurality of 1024K bits (128K bytes × 8 bits per byte) nonvolatile flash memory chips such as those manufactured by Intel Corporation of Santa Clara, Calif. under part number 28F010. Intel Corporation has published (dated March 1989) a twenty-four page specification sheet under an order number 290207-002 (copyrighted Intel Corporation, 1989), describing the operation of the 28F010 1024K CMOS flash memory, which is hereby fully incorporated herein by reference.

In a preferred embodiment of the present invention, 32 surface mount chips are on each side of the memory array board. In one specific arrangement of the present invention, the mass storage device 20 includes one interface circuit board 30, one controller board 40, and five memory boards, i.e., N equals 5. Each memory board has 32 1024K bit chips mounted on each side thereof or a total of 64 1024K bit memory chips per card. This arrangement provides a total mass memory storage capacity of 40M bytes (41,943,040 bytes). This includes error handling overhead of 458,752 bytes and more than 7M bytes (7,484,288 bytes) of reserve storage capacity in a system which requires 34,000,000 bytes of recording capacity.

A data extractor 50 is connected to the data recorder. After the mass storage device 20 records data from the data source 22, such as during the flight of an aircraft that has subsequently crashed or during a test run of a torpedo, the data stored in the mass storage device 20 must be extracted for analysis by appropriate personnel. The data extractor serves this function. In accordance with a preferred embodiment of the present invention, the data extractor 50 provides a power connection to the mass storage device 20 on line 52. The data extractor 50 communicates commands and data to the mass storage device 20 on lines 53. The connection on lines 53 between the data extractor 50 and the mass storage device 20 permits alteration of the internal programs of the mass storage device 20 as well as permits erasure of the data stored in the memory array boards Data from the mass storage device 20 is sent to the data extractor 50 on lines 54.

Preferably, the data extractor 50 is a desk top computer. Such an arrangement permits ease of use on the mass storage device 20 for both program alteration and data analysis purposes.

Figure 2:
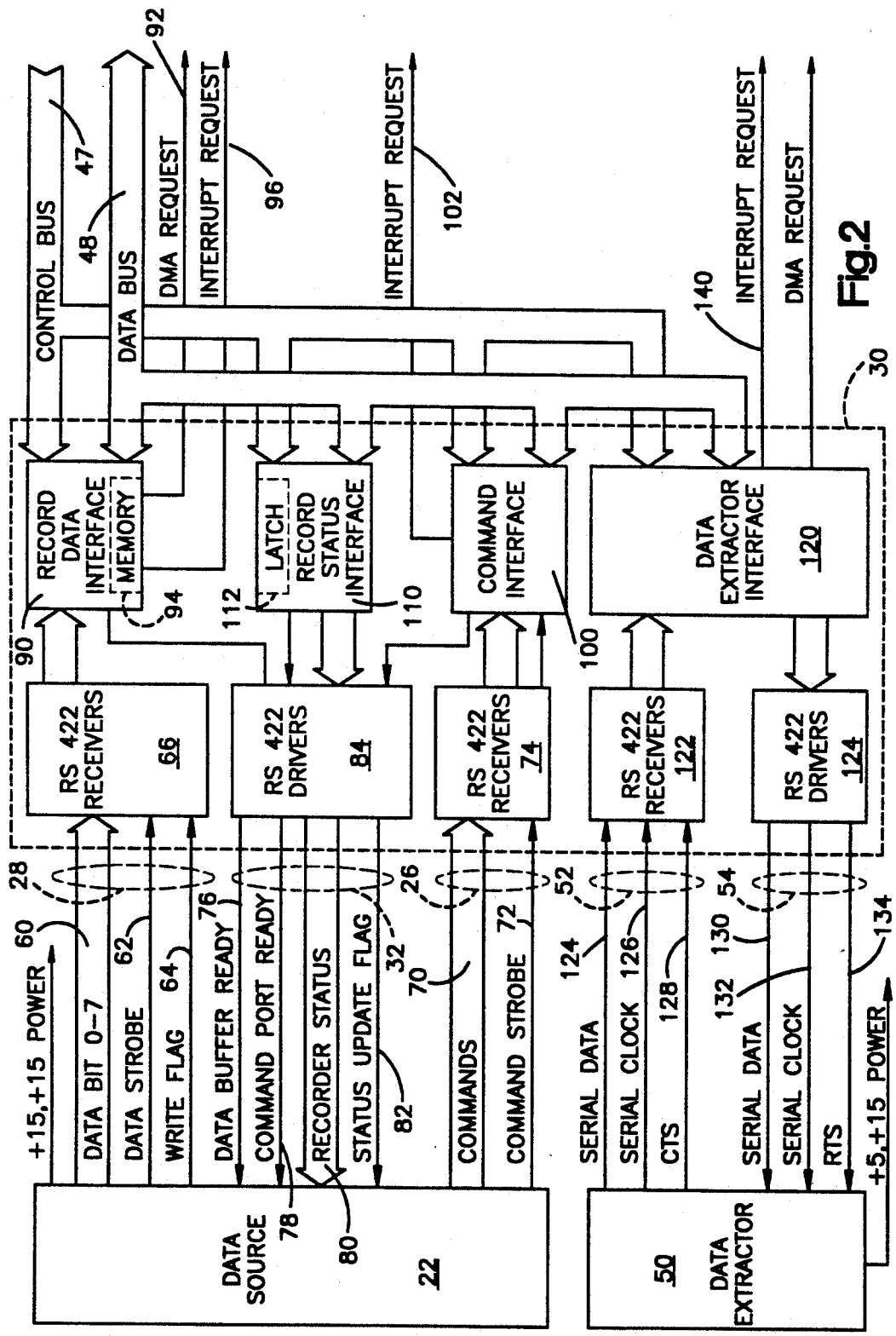
FIG. 2 is a detailed schematic block diagram of the interface circuit board shown in FIG. 1.

Referring to FIG. 2, the interface circuit board 30 includes a plurality of RS422 receivers and drivers. The RS422 drivers convert output signals from the interface circuit board 30 from logic signals to differential RS422 signals. The RS422 receivers convert input signals to the interface circuit board 30 from differential RS422 signals to logic signals.

Specifically, the data source 22 provides eight data bit lines 60, a data strobe line 62, and a write flag 64 which are connected to an RS422 receivers 66 of the interface board 30. The data source 22 provides command lines 70 and a command strobe 72 which are connected to an RS422 receivers 74 of the interface board 30. The interface board outputs a data buffer ready line 76, a command port ready line 78, recorder status lines 80, and a status update flag 82 to the data source 22 from RS422 drivers 84. The recorder status line includes a memory record inhibit line, a self test active line, a recorder ready line, a recorder active line, a built in self test fault line, an end of memory line, and a beginning of memory line.

A record data interface 90 connected to the RS422 receivers 66 and the RS422 drivers 84 receives record data from the data source 22, latches the data, and issues direct memory access ("DMA") requests on a line 92. The data recorder sets the data buffer ready signal inactive while a data byte is being transferred into the data recorder and sets the data buffer ready handshake signal active after the data byte is transferred, provided that the input buffer is not full. In accordance with a preferred embodiment of the present invention, the record data interface includes a first in/first out ("FIFO") memory buffer 94 for storing up to 512 by 9 bits of data while waiting for a response to a DMA request. The record data interface is connected to the control bus 47 and to the data bus 48. The data strobe signal 62 initiates the loading of each byte into the FIFO buffer.

The write flag interrupt occurs when the data is DMA transferred into static RAM from the FIFO. The data is stored in a 512 by 9 FIFO buffer on the interface card by hardware. The state of the write flag is stored with the 8 bits of data for each byte received The data is transferred into static RAM on the processor card by DMA. There are three 16K bytes DMA buffers. When DMA transfers a byte of data which had the write flag in the active state when the data was received, a write flag interrupt is generated. In this way, the program "knows" which byte in RAM was the last byte of a data block by reading the DMA pointer value when the write flag interrupt occurred Some time later, when programming this byte from RAM to flash memory, the program "knows" that it is time to update the data block table The data is read out of the RAM buffers and programmed into the flash memory by the microcontroller 150 under program control.

The interface circuit board 30 further includes a command interface 100 connected to the RS422 drivers 84 and to the RS422 receivers 74. The command interface receives commands from the data source 22 and issues an interrupt signal on line 102 each time a command is received The command interface is also connected to the control bus 47 and the data bus 48. The command strobe signal 72 initiates the reception of a command over the command lines 70. The command port ready signal 78 is set inactive from the time that the command is received to the time that the controller is ready to receive another command.

The interface circuit board 30 further includes a record status interface 110 connected to the RS422 drivers 84, to the control bus 47, and data bus 48. The record status interface includes an output latch 112 which is used to store status bits provided by the controller board. A pulse is generated on the status update flag 82 each time the latch 112 is updated by the controller board.

The interface circuit board 30 includes a data extractor interface 120 connected to the control bus 47 and the data bus 48. Also, the data extractor interface 120 is connected to the data extractor 50 through RS422 receivers 122 and RS422 drivers 124. Specifically, the data extractor provides serial data on line 124, a serial clock signal on line 126, and a handshake signal on line 128 to the interface board 30. The data extractor receives serial data on line 130, a serial clock signal on line 132, and a handshake signal on line 134 from the interface board 30.

The data extractor interface is a bi-directional serial interface used to receive commands from and transmit data and status to the data extractor 50. Command data is received in serial form, converted to parallel and latched. The interface 120 uses the serial clock on line 126 to receive the serial data. The command is a message of some known number of bytes. The processor uses DMA to receive the message. Data from the interface 120 is converted from parallel to serial and output to the data extractor 50. Specifically, data is stored in a RAM buffer and DMA is used to send some number of bytes to the extractor interface which converts the data, byte by byte, into serial form. During transmission of the data to the data extractor 50, serial clock on line 132 is used.

Figure 3:
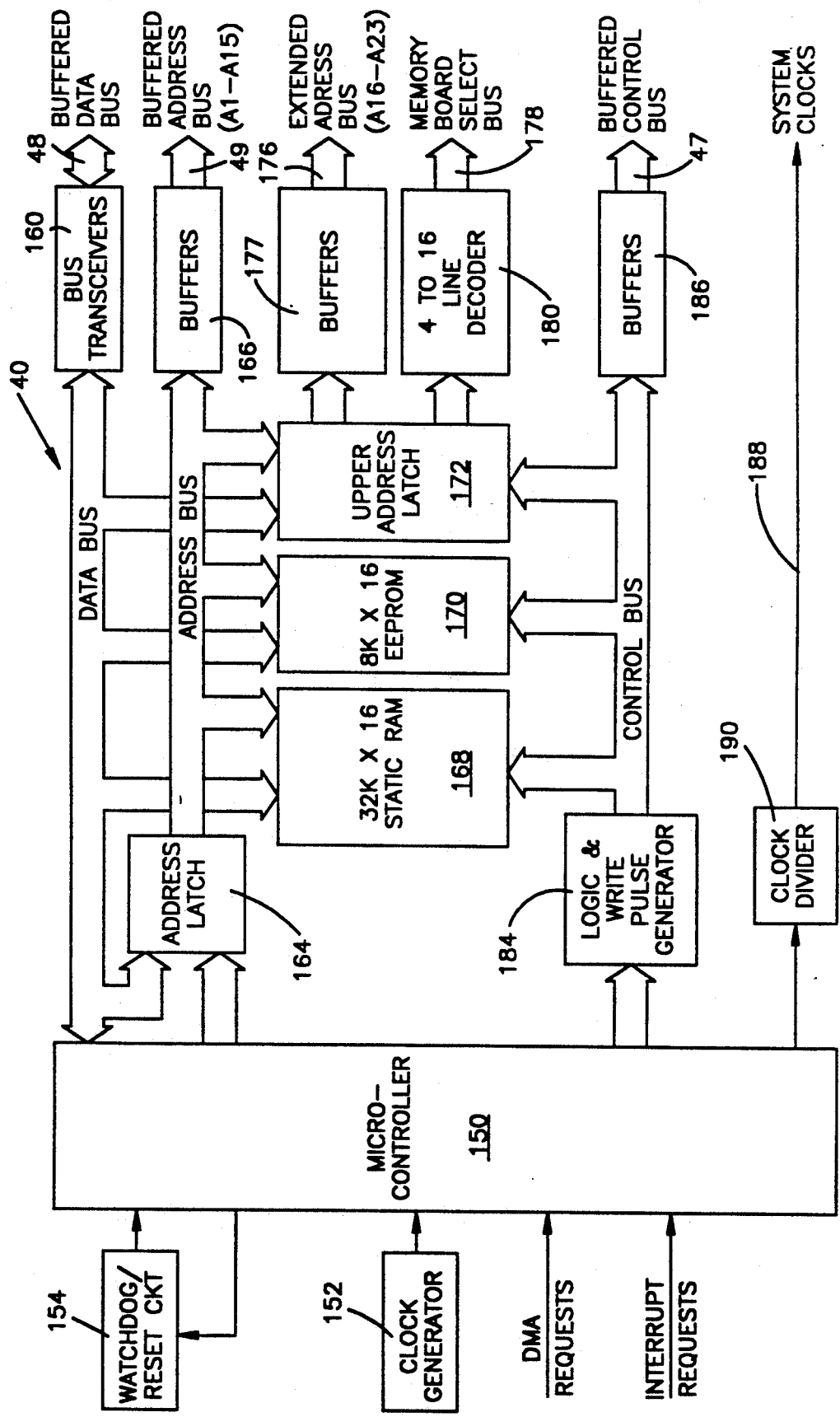
FIG. 3 is a detailed schematic block diagram of the controller circuit board shown in FIG. 1.

Referring to FIG. 3, the controller board 40 includes a microcontroller 150 connected to a clock generator 152. A watchdog circuit 154 of the type well known in the art is also connected to the microcontroller 150. All DMA request lines and interrupt request lines throughout the mass storage device 20 are all connected to the microcontroller 150. The microcontroller 150 is connected to the data bus 48 through a bus transceiver circuit 160. The microcontroller 150 is connected to an address latch 164 which is, in turn, connected to the address bus 49 through a buffer circuit 166.

The output of the address latch 164 is further connected to a static RAM 168, an EEPROM 170, and an upper address latch 172. Each of the static RAM 168, the EEPROM 170, and the upper address latch 172 are connected to the internal data bus of the controller board 40. The upper address latch 172 is further connected to an extended address bus 176 through a buffer 177 and to a board select bus 178 through a line decoder 180.

The microcontroller 150 is connected to the control bus 47 through a logic and write pulse generator 184 and buffers 186. The static RAM 168, the EEPROM 170, and the upper address latch are connected to the output of the logic and write pulse generator 184 which is an internal control bus for the controller board 40. The microcontroller 150 further provides system clock signals 188 as need through a clock divider circuit 190. The microcontroller 150, in accordance with one embodiment of the present invention, is a 80C186 manufactured by several microcontroller manufacturers.

The microcontroller 150 performs the formatting and recording functions of the mass storage device 20. The microcontroller is, preferably, a high-integration processor which contains a 16-bit microcontroller, two DMA channel, timers, an interrupt controller, and chip select logic. The static RAM 168 is used for firmware variable storage and provides a buffer to store incoming data which is transferred from the record data interface 90 to the static RAM 168 via DMA. The EEPROM 170 contain firmware for the microcontroller 150 and includes a configuration table which identifies which memory boards are present and what the size of the memory boards are and includes a bad bank table EEPROM also contains pass/fail status of self tests. The band bank table indicates which banks are to be skipped over because it had previously been determined that the bank should be skipped due to suspect memory chips The extractor loads the bad bank table during the extraction/erase process.

The extended address latch 172 is used to generate the upper address bits required to address the flash proms on the memory array boards 42, 44, 46. The line decoder 180 is used to select one of the memory array boards for recording.

Figure 4:
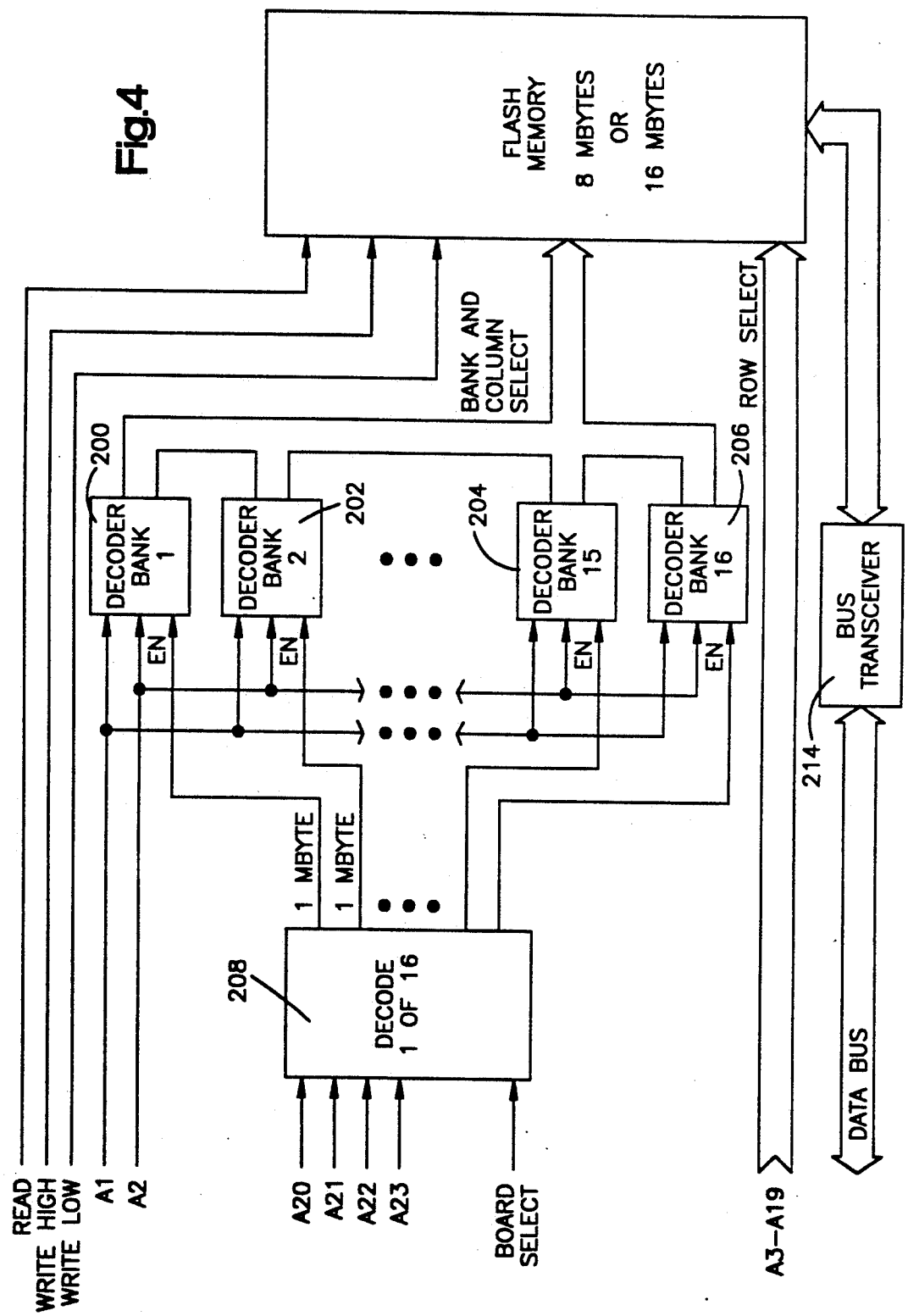
FIG. 4 is a detailed schematic block diagram of a memory array board shown in FIG. 1.

Referring to FIG. 4, an arrangement for a single memory array board is shown For simplicity and ease of discussion, only one memory array board is discussed, it being understood that each of the other memory array boards are similarly arranged. The address bus 49 is connected to a plurality of decoders 200, 202, 204, 206, 208. Data into and out of the flash memory goes through bus transceivers 214.

Address lines A1 and A2 are connected to each of the decoders 200, 202, 204, and 206. Memory lines A20, A21, A22, and A23 and a board select line are connected to the decoder 208. Address lines A3–A19 are connected to the address inputs of the flash memory.

Figure 5:
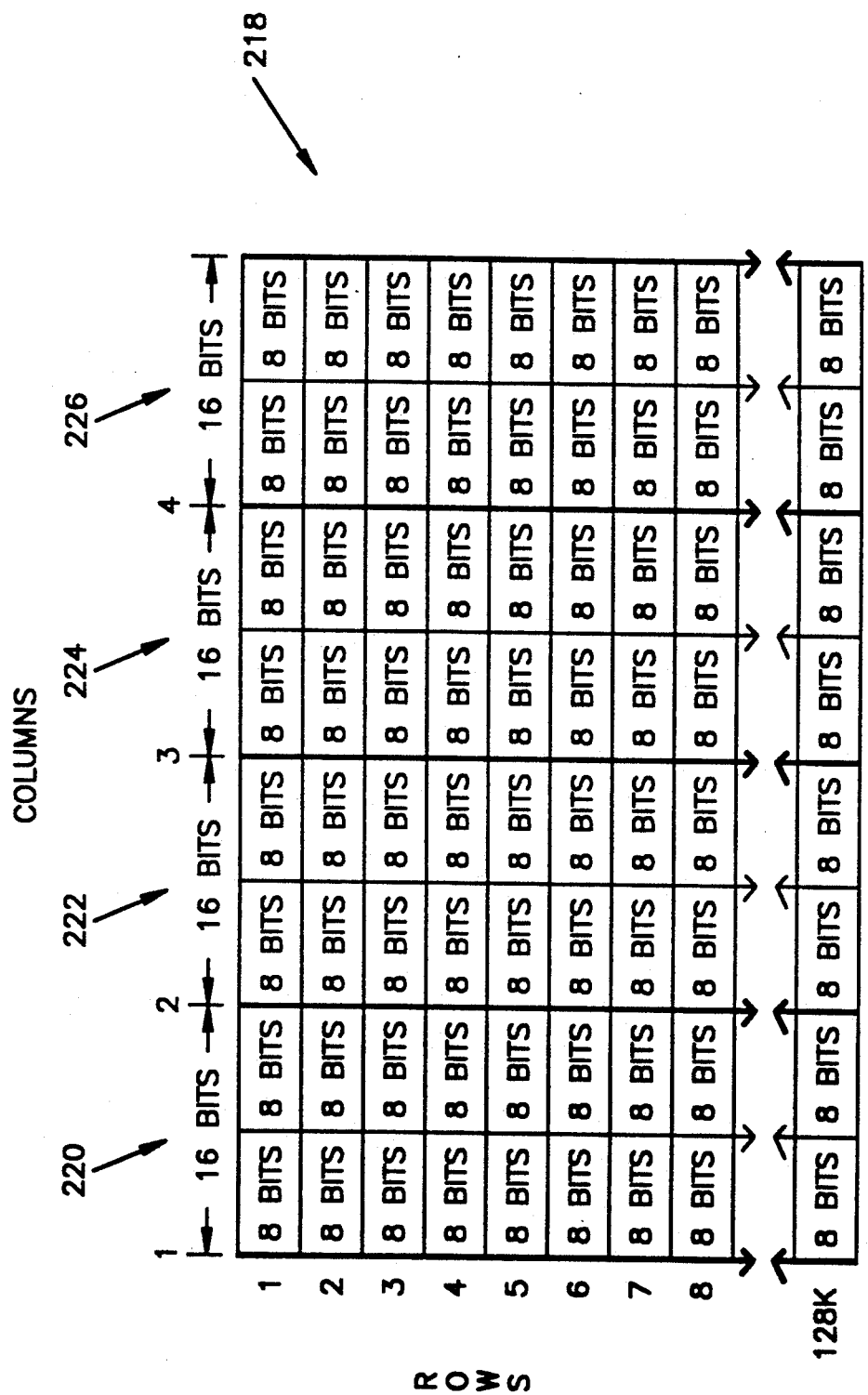
FIG. 5 is a diagram showing the memory arrangement for a single bank of memory (1 Mbyte)

Referring to FIG. 5, the arrangement of a portion of the memory 218 on a memory array board is shown. Each of the flash memory chips is 128K by 8 bits. The memory is organized into 4 16-bits word locations 220, 222, 224, and 226. There are 8-bits per byte and 16-bits per word. It takes two 8-bit wide flash memory chips to make each 16-bit word location.

Further, the rows are grouped into banks, each bank having 1 megabyte of memory. There are either 8 or 16 banks of memory on each memory array board. Each bank physically consists of 8 flash memory chips. When 256K by 8 bit flash memory chips are used, each bank physically consists of one-half of the memory of the 8 flash memory chips. Data recorded in the memory is organized into blocks of variable size. A maximum block size, in accordance with a preferred embodiment of the present invention, is 32,752 bytes.

Each of the four word column locations has its own associated address. Addresses A16 through A23 and the board select signals are generated from the upper address latch of the controller.

Address lines A2 and A1 are used to select the word column 1 through 4. Address lines A20, A21, and A22 are used to select the memory bank, i.e., a group of 8 memory chips. Address lines A3–A19 select the specific address within a set of two ICs that are selected by A1 and A2 and A20, A21, and A22. This address scheme is easily adaptable in a memory arrangement in which each memory card includes 16M bytes by adding an address line A23 to select between a first and second megabit of memory on a 2M bit memory chip.

The read signal (RD) connects to each of the memory chips and is used to enable the data from the selected memory address onto the data bus for the controller to access. There are two write signals, write high byte (WRH) and write low byte (WRL). Data can be selectively written to either the high or low byte of each word, or to both bytes simultaneously. In this specific embodiment, two memory chips are written to and read from simultaneously using a 16 bit data bus. It can be seen that a larger size data bus could be used to obtain faster recording speeds.

Figure 6:
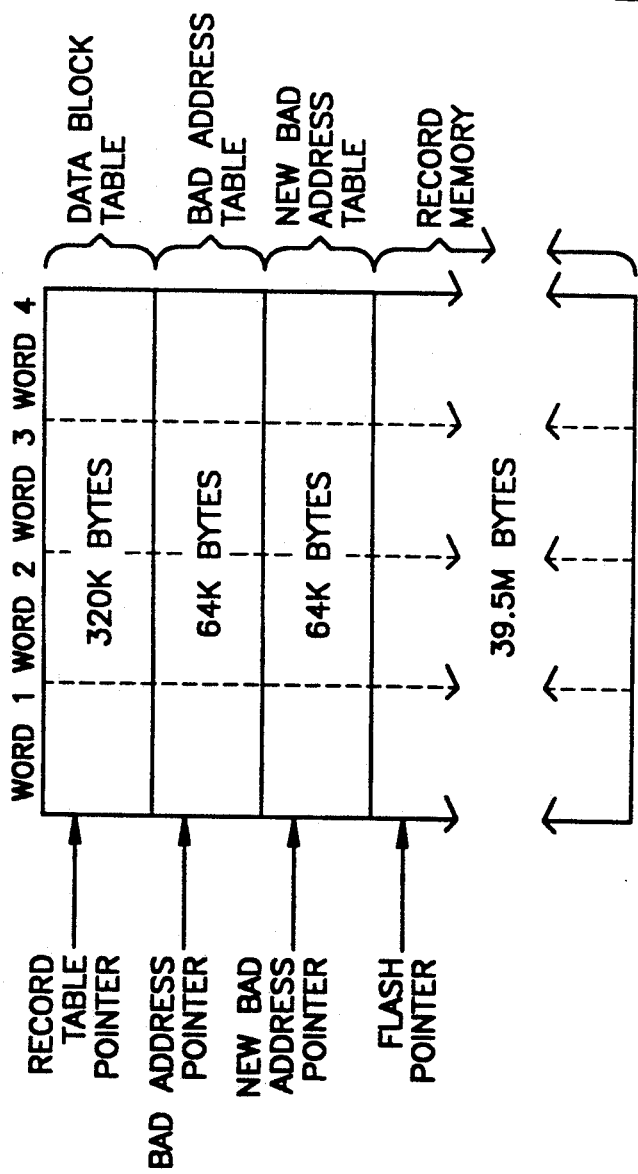
FIG. 6 is a memory map of the mass storage device shown in FIG. 1.

Referring to FIG. 6, the organization of the flash memory is shown with its overhead allocation. The first part of the first bank of memory is used to store three tables: data block table, bad address table, and new bad address table. If the first bank of memory is marked "bad" in the bad bank table stored in EEPROM, the recorder searches the bad bank table and uses the first part of the first non-bad bank of memory for the tables.

The first 320K bytes of memory is set aside as a data block table. A data block is defined by the data source as a certain number of data bytes. The data source identifies the end of a data block by making the write flag active during transfer of the last byte of the block. In accordance with a preferred embodiment of the present invention, a maximum size of a data block is 32,752 bytes. The data block table is used to store the address corresponding to the beginning of each data block recorded The data block table also includes a checksum for each block of data recorded. The data block table information is stored redundantly and includes parity for each redundant entry. A data block table pointer is used to keep track of the address of the next available entry location in the table. The data block table is used to determine the starting point for recording after a power off/on cycle. The maximum block size (32,752) is added to the beginning address of the last block recorded to determine where the next data block should begin.

The next 64K bytes of memory is set aside as a bad address table. During recording, the bad address table is interrogated to determine if the row to be programmed next (8 bytes) contains a bad address. If the row address is found in the bad address table, the recorder does not attempt to write to the row. The bad address table is interrogated again to determine if the next row address is in the bad address table. This continues until a row address is found that is not in the bad address table. The bad address table is loaded from the extractor during the extract/erase process. A bad address table pointer is used to keep track of the address of the next bad address entry in the table.

The next 64K bytes of memory is set aside as a new bad address table. As a part of programming an addressed row in memory, the data must be read out and verified. If any of the 8 bytes of data cannot be properly programmed into a row after several attempts, that row is considered bad, and the row address is recorded in the next available location of the new bad address table. An attempt is then made to program the same data into the next row which is not already contained in the bad address table. A new bad address table pointer is used to keep track of the address of the next bad address entry in the table. The new bad address table is extracted along with the bad address table during the extract/erase process. The row addresses are sorted into sequential order, and are then re-loaded into the bad address table and the new bad address table is erased prior to the next mission. When a number of bad addresses are found in a bank, the bad addresses are removed from the bad address table and the bad bank table (in EEPROM) is updated.

The remainder of the flash memory is used to record data from the data source. A flash pointer is used to locate the next available row that can be programmed into the flash memory.

Figure 7:
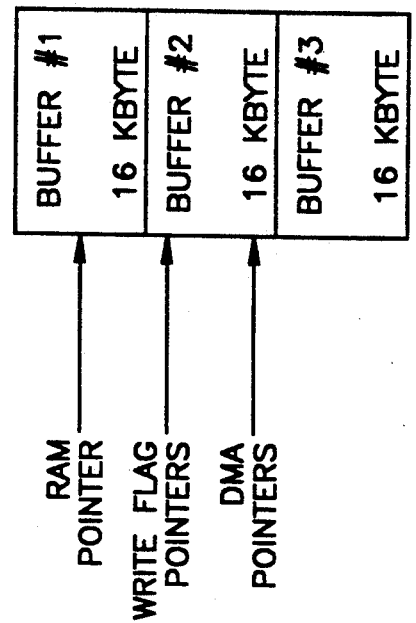
FIG. 7 is a schematic of a RAM buffer which is part of the static RAM shown in FIG. 3.

Referring to FIG. 7, the record data buffer memory, which is part of the static RAM, is shown. The buffer memory is divided into three 16K byte RAM buffers. A DMA pointer is used to indicate the location in the buffer memory where data from the data source is presently being written to, after being read from the FIFO buffer memory. A RAM pointer is used to indicate the location of the static RAM DMA buffer where data is presently being read out of the static RAM to be recorded into the flash memory. A write flag pointer is used to identify the last byte of a group of data that is defined as a block of data by the data source through the use of the write flag signal. As mentioned, the microcontroller limits a data block to 32,752 bytes.

Referring to FIG. 8, a flow diagram is depicted showing a control process for programming a mass storage device in accordance with the present invention This process is for a mass storage device of the type shown in FIGS. 1-5 with a data source 22 connected thereto In step 400, the first step of the control process, the mass storage device is initialized.

Figure 9:
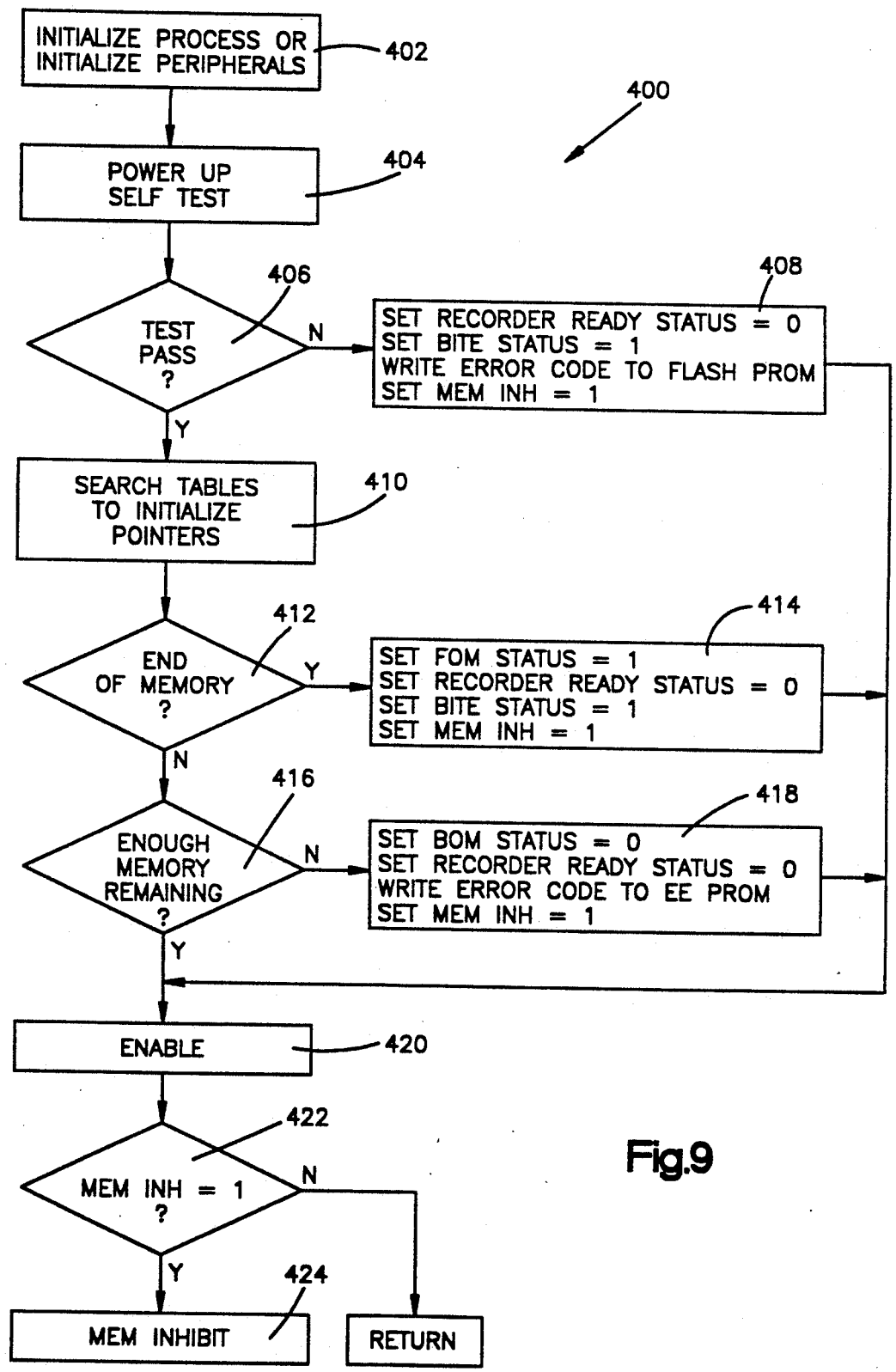
FIG. 9 is a flow diagram showing detail of the initialization step of FIG. 8.

The details of the initialization step 400 is depicted in FIG. 9. In step 402, the microcontroller 150 and all circuit peripherals are initialized and all program variable stored in static RAM are initialized A power-up self test is performed in step 404. The power-up self tests include a memory test of the static RAM 168, and testing of the configuration tables in the EEPROM 170. A code checksum test of the type well known in the art is also performed.

In step 406, a determination is made as to whether the power-up self test in step 404 passed. If the determination in step 406 is negative, the recorder ready status output on lines 80 is let to 0, i.e., a logic LOW, a built-in self test ("bite") status line on lines 80 is set to 1, i.e., a logic HIGH, to indicate that the error occurred during a the power-up self test, an error code is written into the EEPROM 170, and a memory inhibit flag is set to a 1 in step 408. If the determination in step 406 is affirmative, the process proceeds to step 410 where the data block table, bad address table, and new bad address table in the flash memory are search to initialize the address pointers and determine the starting address for recording. The address pointers are then set.

The process then proceeds to step 412 where a determination is made as to whether the mass storage device is at its end of memory. If the determination in step 412 is affirmative, the process proceeds to step 414 where the end of memory ("EOM") status is set equal to 1, the recorder ready status is set equal to 0, and the bite status is set equal to 1, and a memory inhibit flag is set to a 1. If the determination in step 412 is negative, the process proceeds to step 416 where a determination is made as to whether there is sufficient memory remaining in the mass storage device to complete a recording cycle. Once the recorder is programmed, i.e., stores data, the data remains until erased by the data extractor 50. After a power off/on cycle, the recorder begins to record data from a memory location after any previously recorded data to preclude overwriting recorded data. In the data recorder EEPROM, a value is stored which corresponds to the minimum memory remaining required to complete a mission. This value is changeable through commands over the extraction interface The determination is step 416 is accomplished by knowing how much memory is needed and how much memory is left.

If the determination in step 416 is negative, the process proceeds to step 418 where a beginning of memory ("BOM") line is set to 0, the recorder ready status is set to 0, and the error code is written to EEPROM 170, and a memory inhibit flag is set to a 1. If the determination in step 416 is affirmative, or if the process performed steps 408, 414, or 418, the process proceeds to step 420. In step 420, the recorder is enabled. The process proceeds to step 422 where a determination is made as to whether the memory inhibit flag is set to a 1. If the determination is affirmative, the process proceeds to step 424 where the recorder is inhibited from recording. If the determination in step 422 is negative, the recorder is permitted to record incoming data from the data source 22.

Referring back to FIG. 8, the process proceeds to step 450 where a determination is made as to whether data is available from the data source 22 for recording. If the determination in step 450 is negative, the process proceeds to step 452 where a determination is made as to whether there is a recorder inhibit command has been received from the data source. If the determination is step 452 is negative, the process proceeds to step 454 where a determination is made as to whether power has been removed. If the determination is step 454 is negative, the process returns back to step 450. If the determination in either step 452 or step 454 is affirmative, the process proceeds to step 456 where the recorder is stopped.

If the determination in step 450 is affirmative, the process proceeds to step 460 where the data block table in the flash memory is updated by recording the address of the first byte of the first block of data recorded. The process then proceeds to step 462 where the recorder active status is set to 1 which indicates that the recorder has started to record data. When the recorder status is updated, a signal is sent to the data source indicating that the recorder is active.

The process then proceeds to step 466 where a determination is made as to whether there are 256 bits of data available for recording in the flash memory. If the determination is affirmative, the process proceeds sequentially to steps 470, 472, 474, 476 where, in each step, 64 bits of data is written to the flash memory. The first 64 bits is written in step 470, the next 64 bits in step 472, the next 64 bits in step 474, and the last 64 bits in step 476. The process then loops back to step 466.

If the determination in step 466 is negative, the process proceeds to step 480 where a determination is made as to whether there are 64 bits of data available for recording in the flash memory. If the determination in step 480 is affirmative, the process proceeds to step 482 where the 64 data bits are written to memory. From a negative determination in step 480 or after writing the 64 data bits in step 482, the process loops back to step 466.

If a write flag should go active without having at least 64 data bits available for recording, the microcontroller "pads" the remainder of the data bits to make a group of 64, i.e., the microcomputer generates data to complete a group of 64 to wherever the actual data left off.

Figure 10:
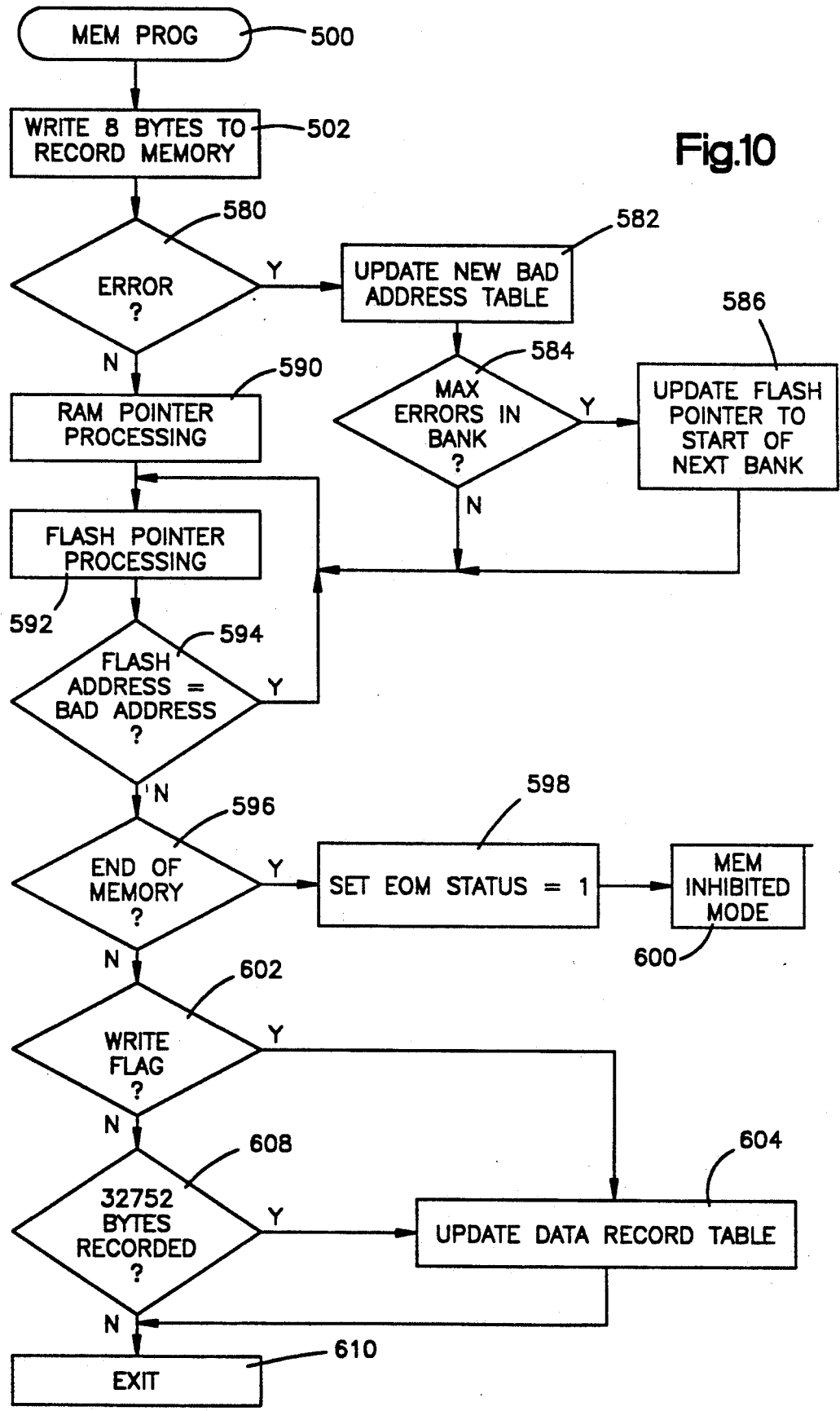
FIG. 10 is a flow diagram showing the memory program process.

Referring to FIG. 10, a flow chart is shown depicting the process for programming the flash memory in accordance with the present invention. The process begins at step 500. In step 502, 8 bytes of data are written into the flash memory. The step 502 is the write task from any of the steps 470, 472, 474, 476, 482. To accomplish the write task, the process is followed which is depicted in FIG. 11.

The write program starts at step 510. In step 512, all interrupts are inhibited. The process proceeds to step 514 where the word to be written is placed in a checksum accumulator. The write program command is written to the flash address identified by the flash address pointer Referring also to FIG. 5, if the location to be written is row 1, column 1, of the flash memory, the write command is written to that location The flash memory requires a predetermined minimum time period to process the write command signal. In accordance with the present invention, the write command is sequentially written to the¹ address of the flash pointer plus 2, i.e., row 1, column 2, while the write command is being processed in the first column; then to the address of the flash pointer plus 4, i.e., row 1 column 3, while the write command is being processed in columns 1 and 2; and finally to the address of the flash pointer plus 6, i.e., row 1 column 4, while the write command is being processed in column 1, 2, and 3. After writing a command or data to a chip, the minimum and maximum time must be met before writing further commands or data, or reading from that chip. Each word column of a bank is physically two memory chips. Therefore, when writing sequentially to word columns within a row, each write is to a separate set of two chips. It can be seen that the design could be modified to extend the number of columns to further increase the speed of recording.

The column address are changed by the address lines A1 and A2. The two bytes within a column are controlled by the address line read, write high, and write low lines from the microcontroller. It should be appreciated that the address of the flash pointer must be changed by 2 to move over a complete column which is made up of two bytes.

The flash memory also specifies a maximum predetermined time period that is permitted to lapse after a command is given before the next command must be received. Therefore, the number of columns for which a command can be stepped across is dependant upon the speed at which the commands can be output and this predetermined maximum time period. Therefore, in the specific embodiment described, it is assumed that the microcontroller will return from row 1, column 4, back to row 1, column 1, to issue the next command in a time period that falls within a window defined by the predetermined minimum processing time and the maximum time period between commands. Similarly, all subsequent passes through each of the memory locations must fall within this window.

The process proceeds from step 514 to step 516 where the first data word (2 bytes) are output to row 1, column 1. While this word is being processed by the memory location at row 1, column 1, word two is output to row 1, column 2, which is the address location of the flash pointer plus 2. While word 2 is being processed by the memory location at row 1, column 2, word three is output to row 1, column 3, which is the address location of the flash pointer plus 4. While word 3 is being processed by the memory location at row 1, column 3, word four is output to row 1, column 4, which is the address location of the flash pointer plus 6. As with the command in step 514, the timing of the steps within step 516 are such that the process returns back to row 1, column 1, after the predetermined minimum processing time but before the maximum time period permitted between command signals.

The process proceeds to step 518 where the write verify step for the four words is performed. Specifically, in step 518, the write program verify command is output to row 1, column 1, which is the location of the address for the flash pointer. The flash memory requires a predetermined minimum time period to process the write verify command. In accordance with the present invention, the write verify command is sequentially written to the address of the flash pointer plus 2, i.e., row 1, column 2, while the write verify command is being processed in the first column; then to the address of the flash pointer plus 4, i.e., row 1 column 3, while the write verify command is being process in column 2; and finally to the address of the flash pointer plus 6, i.e., row 1 column 4, while the write verify command is being processed in column 3.

Also, in step 518, word 2, word 3, and word 4 are added to the checksum accumulator. The program proceeds to step 520 where the checksum accumulation calculated in step 518 is added to the total checksum for the block. Recall that the block is defined by the data source by the write flag bit going active to mark the end of the block and that the microcontroller limits the block size to 32,752 bytes.

The process proceeds to step 522 where the data is read from the address pointer. The process then proceeds to step 524 where a determination is made as to whether the data read from the flash address pointer is equal to word I that was written into the word 1 location of. the memory. If the determination in step 524 is positive, the process proceeds to step 526 where the data is read from the address pointer plus 2. The process then proceeds to step 528 where a determination is made at to whether the data read from the flash address pointer plus 2 is equal to word 2 that was written into the word 2 location of the memory. If the determination in step 528 is positive, the process proceeds to step 530 where the data is read from the address pointer plus 4. The process then proceeds to step 532 where a determination is made at to whether the data read from the flash address pointer plus 4 is equal to word 4 that was written into the word 3 location of the memory. If the determination in step 532 is positive, the process proceeds to step 534 where the data is read from the address pointer plus 6. The process then proceeds to step 536 where a determination is made at to whether the data read from the flash address pointer plus 6 is equal to word 6 that was written into the word 4 location of the memory. If the determination in step 532 is positive, the process proceeds to step 538 where all the interrupts disabled in step 512 are enabled.

If the determination in step 524 is negative, the process proceeds to step 550 where the data at the flash address pointer plus 2 is read. If the determination in step 528 is negative or if the process completes step 550, the process proceeds to step 552 where the data at the flash address pointer plus 4 is read. If the determination in step 532 is negative or if the process completes step 552, the process proceeds to step 554 where the data at the flash address pointer plus 6 is read. If the determination in step 536 is negative or if the process completes step 554, the process proceeds to step 556 where the interrupts disabled in step 512 are enabled.

From step 556, the process proceeds from step 556 to step 558 where an error counter is incremented. In step 560, a determination is made as to whether the error count is equal to a maximum count In accordance with a preferred embodiment of the present invention, the maximum error count is equal to 5. If a reading error occurs in any of the four words, the remainder of the words must be read. If the determination in step 560 is negative, the process loops back to step 512. This loop insures that there are five (maximum predetermined number) attempts to program and read verify the data correctly. If the determination in step 560 is affirmative, the process proceeds to step 562 where an error flag is set equal to a logic 1 or HIGH. The process proceeds from step 538 or 562 to step 566 where the program exits back to that shown in FIG. 10.

The process proceeds from step 502 to step 580 where a determination is made¹ as to whether the read error flag has been set in step 562. If the determination in step 580 is affirmative, the new bad address table in the flash memory is updated in step 582 with the address for the row in which the error was detected The process proceeds to step 584 where a determination is made as to whether a predetermined maximum number of new bad addresses detected has occurred in the memory bank presently being processed. If the number of rows with errors for the bank being processed exceeds the predetermined maximum number, the determination in step 584 is affirmative and the process proceeds to step 586. Once the number of new bad addresses in a bank exceeds the predetermined maximum, the bank is assumed bad and the flash pointer is moved to the start of the next bank.

If the determination in step 580 is negative, the process proceeds to step 590 where the RAM pointer is processed by moving the pointer to where the next 8 bytes of data to be recorded will be stored in static RAM. If the process proceeds from step 590, a negative determination in step 584, or from step 586, the process proceeds to step 592. In step 592, the flash pointer is processed by incrementing the pointer by 8. The process proceeds to step 594 where a determination is made as to whether the flash address, after being incremented, is at a bad address. This determination is made by comparing the address location against the bad address locations stored in the bad address table. If the determination in step 594 is affirmative, the process loops back to step 592 where the flash pointer is incremented by another 8. If the determination in step 594 is negative, the process proceeds to step 596.

In step 596, a determination is made as to whether the recorder is at the end of the memory. If the determination in step 596 is affirmative, the process proceeds to step 598 where the end of memory ("EOM") status is set to a digital HIGH or 1. The process then switches to a memory inhibit mode in step 600.

If the determination in step 596 is negative, the process proceeds to step 602 where a determination is made as to whether or not the 8 bytes just programmed where the last 8 bytes or a data block. This determination is made by interrogating the write flag pointers which were set when the last byte of a data block was received. The write flag signal was active when the last byte of a data block was received. The write flag being active indicates an end of a data block. If the determination in step 602 is affirmative, the process proceeds to step 604 where the data record table is updated. The address of the first byte of the next data block is recorded in the data block table.

If the determination in step 602 is negative, the process proceeds to step 608 where a determination is made as to whether the block size is at the maximum size The maximum size in accordance with a preferred embodiment of the present invention is 32,752 bytes. If the determination in step 608 is affirmative, the process proceeds to step 604. From step 604 or from a negative determination in step 608, the process proceeds to step 610 where the write process is ended.

Referring to FIG. 8, if the 64 bits or 8 bytes are written to the record memory as a result of step 470, the process of FIG. 10 and FIG. 11 are repeated in step 472, again in step 474, and again in step 476. If the 64 bits or 8 bytes are written to the record memory as a result of step 482, the process of FIG. 10 and FIG. 11 are performed one time.

Figure 12:
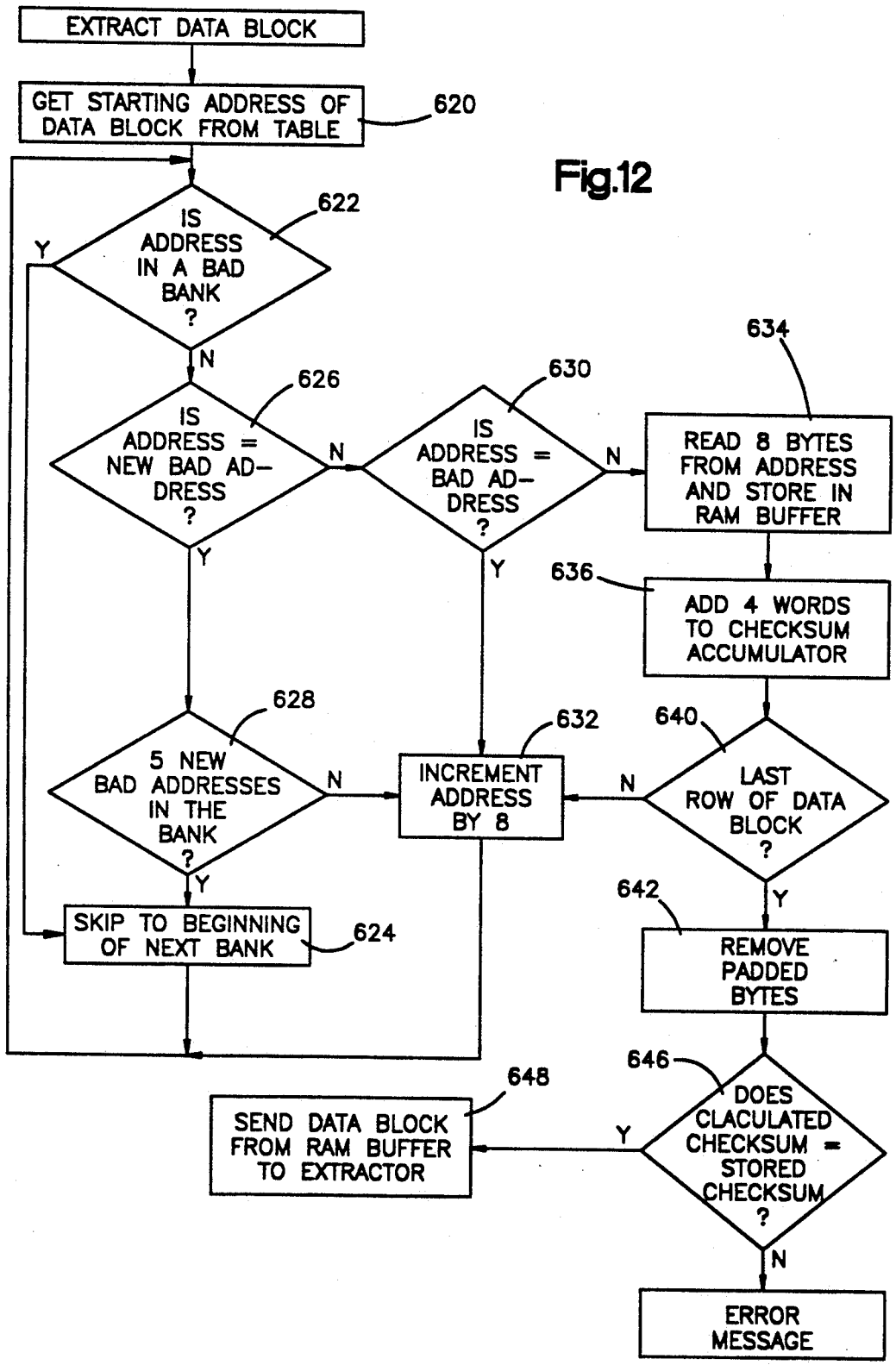
FIG. 12. is a flow diagram showing the process for reading data by the data extractor shown in FIG. 1.

The data extractor 50 is used to read the data from the recorder and to erase the recorder The process for data extraction is shown in FIG. 12. The data extractor uses serial communications to send command messages and receive responses and data from the data recorder to extract data and erase the recorder.

During extraction, the tables are read from the recorder memory first, then the recorded data blocks are read. Extracted data is read from the flash memory and stored in a static RAM buffer before being sent to the extractor. The data extraction process is repeated for each data block recorded.

An address is read in step 620. A determination is made in step 622 as to whether an address is a bad bank. If the determination is affirmative, the addresses skip to the next bank in step 624. If the address is not in a bad bank a determination is made in step 626 as to where the address is a new bad address. If it is, a determination is made in step 628 as to whether there are 5 new bad addresses in the bank. If there are 5 new bad address in the bank, the process proceeds to step 624. If the address is not a new bad address, a determination is made in step 630 as to whether the address is a bad address. If the address is bad or if it is a new bad address but there are not 5 new bad addresses in the bank, the process proceeds to step 632 where the address is incremented by 8. If the address is not bad, the 8 bytes are read from the flash memory and stored in a RAM buffer in step 634. Four words are added to the checksum in step 636 and a determination is made as to whether the row is the last of the data block in step 640. If it is not, the process repeats. If it is, padded bytes are removed in step 642. The checksum is verified in step 646 and the data block is sent to the extractor in step 648 if the checksum is equal. Otherwise an error message is provided in step 650.

As can be seen, the recorder skips over each row of 8 bytes whose address is stored in either the bad address table or the new bad address table. The recorder skips over any bank which is marked as bad in the bad bank table or any bank which has 5 or more new bad address table entries. The recorder also removes any padded bytes required for any data block. In this way, only the actual record data sent during the mission is extracted. A checksum is calculated for each data block extracted and is compared with the recorded checksum.

The data extractor 50 is also used to erase the flash memory. Each bank which contains recorded memory is erased. When a flash memory chip is properly erased, each bit in the chip is at a logic 1 or logic high level.

During the erase process, the tables are read from the flash memory before erasing. Prior to erasing a flash memory chip, each bit in the chip must first be programmed to a logic 0 or logic low level. All bytes of each bank are programmed to 0, with the exception of banks which are marked as "bad" in the bad bank table.

Figure 11A:
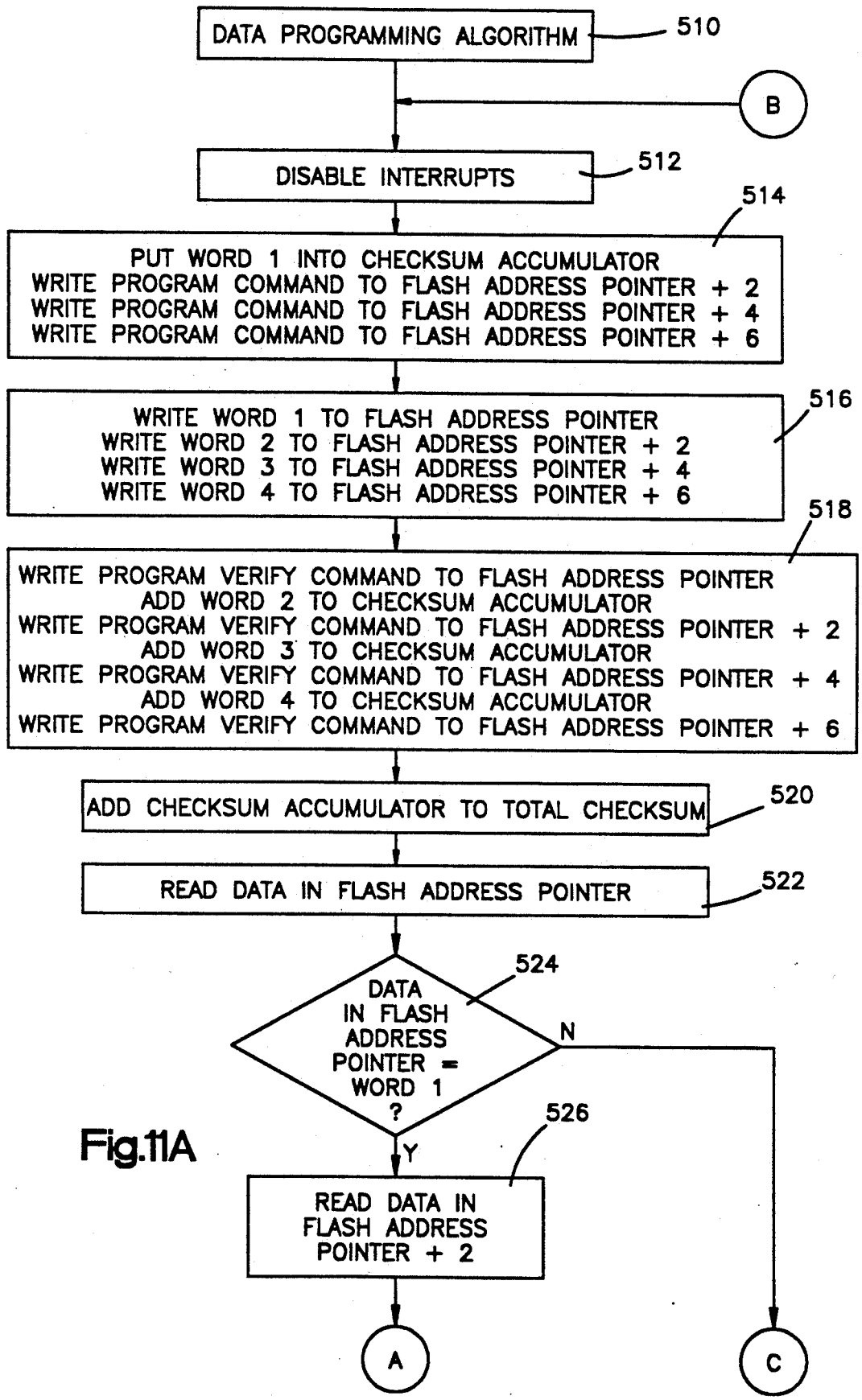
FIGS. 11A and 11B are flow diagrams showing the process for the write to record memory step of FIG. 10.
Figure 11B:
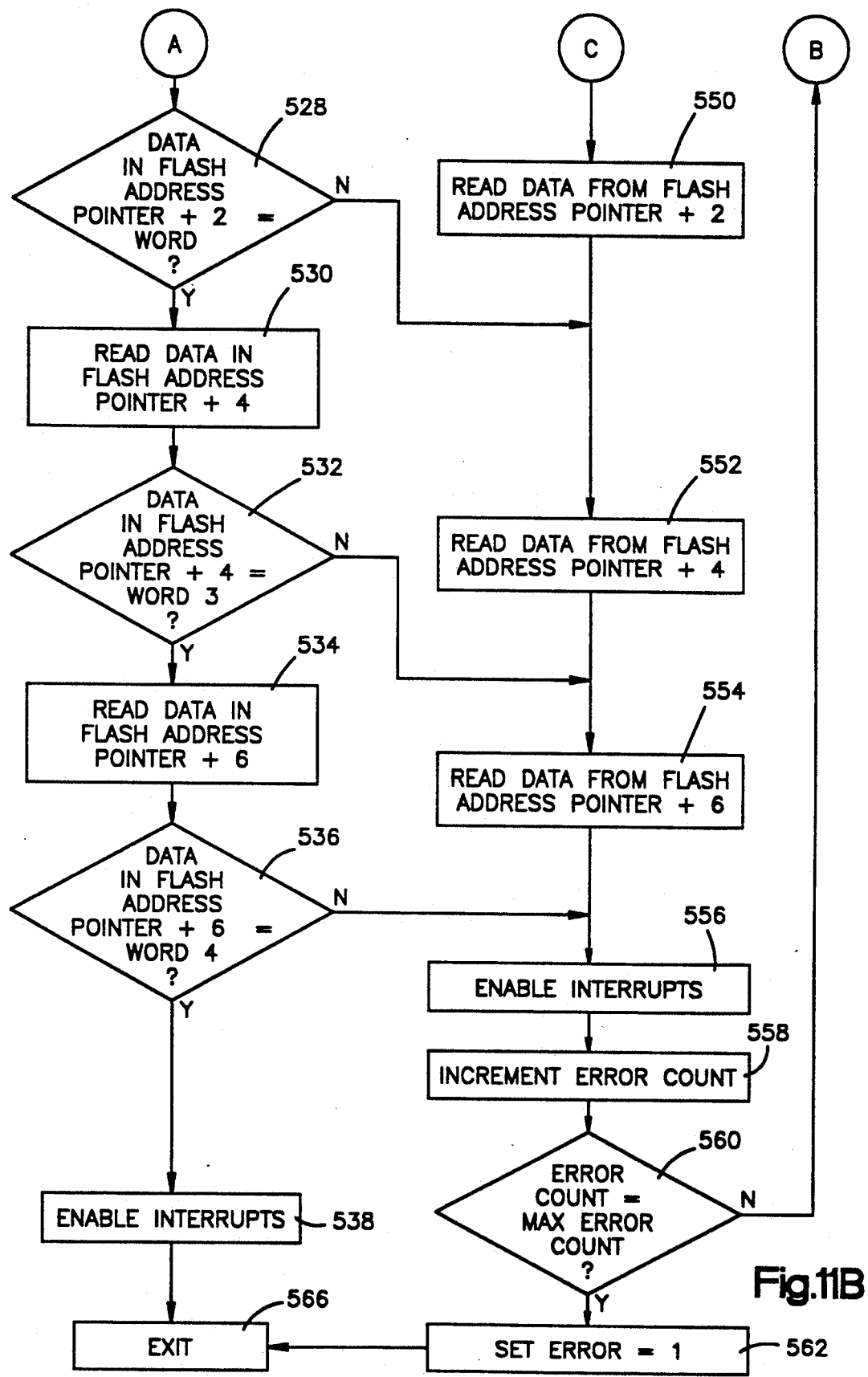
Figure 13:
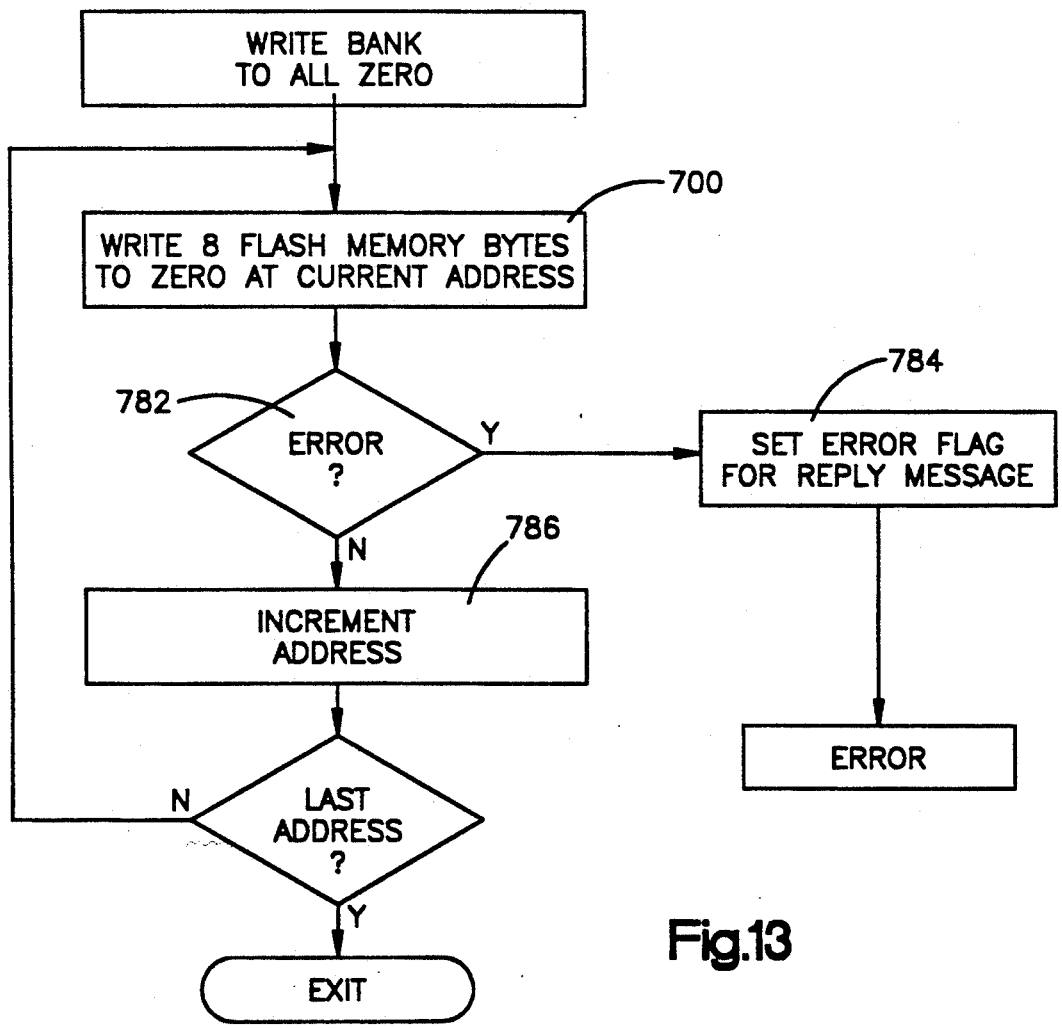
FIG. 13 is a flow diagram showing the process for writing zeros to the flash memory for erasing purposes.

The process of writing 0 to each address of a bank is shown in FIG. 13. Step 700 writes 0 to the 8 addresses at the current flash pointer address The process of FIGS. 11A and 11B is used to perform step 700. A determination is made in step 782 as to whether the last 8 bytes were successfully programmed to 0. If the programming was not successful, the reply message is sent to the extractor in step 784 to indicate that the bank could not be completely programmed to 0. The extractor will update the recorder bad bank table to mark the bank as bad. If the programming of the 8 bytes was successful, the address is incremented to the next row in step 786 and the process is repeated until the entire bank has been programmed to 0.

Figure 14B:
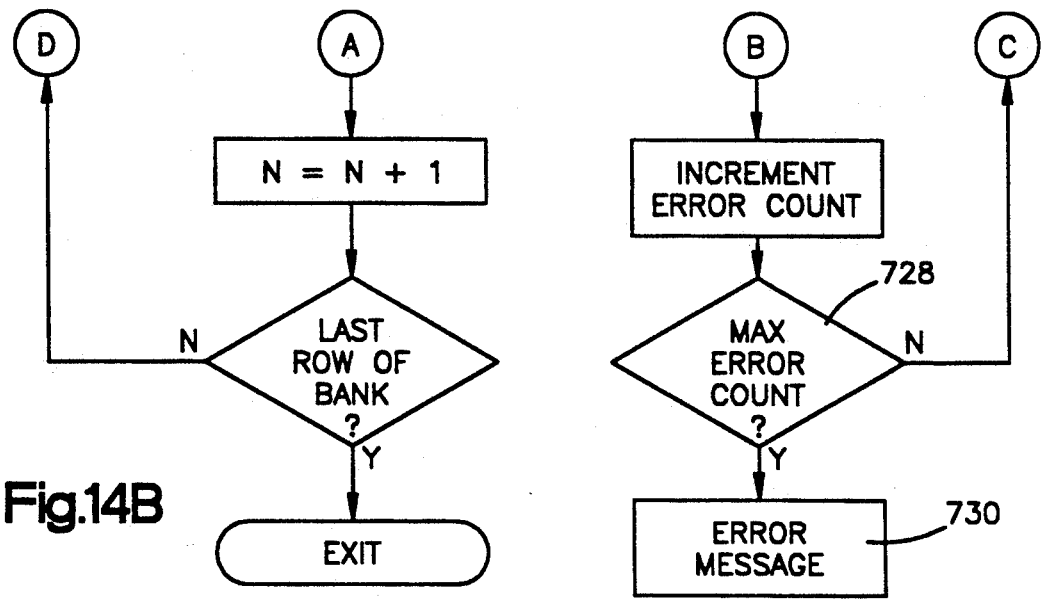
FIGS. 14A and 14B are flow diagrams showing the process for erasing the flash memory shown in FIG. 1.
Figure 14A:
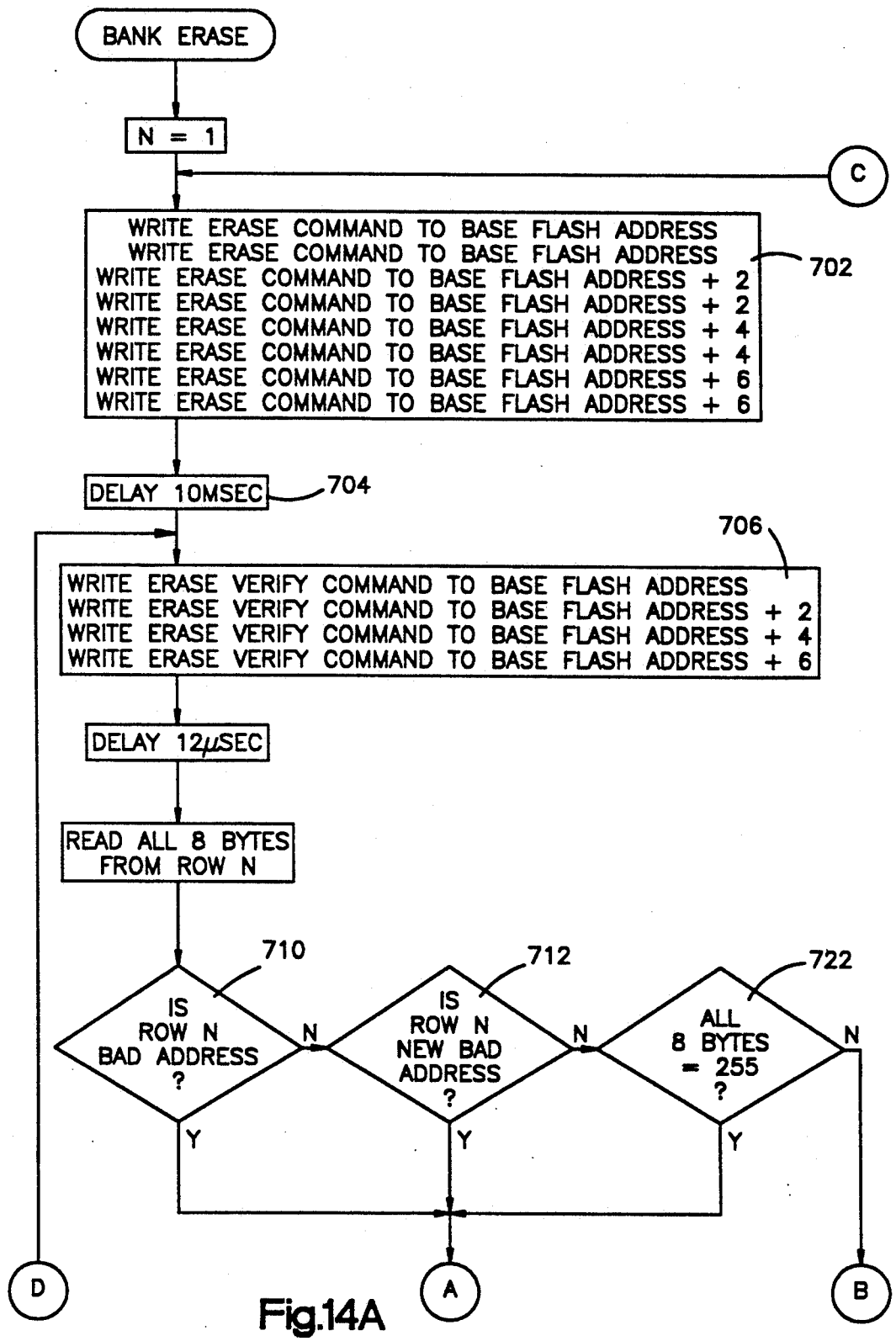

After a bank has been completely programmed to 0, the bank is erased. The process of FIGS. 14A and 14B is used to erase a bank of flash memory. This is repeated for each bank of memory which was written to during the mission. Referring to FIGS. 14A and 14B, in step 702, the erase commands are written to each of the 4 word column addresses (8 memory chips) in a bank. After a delay in step 704, the write erase verify command is sent to each of the memory chips in step 706. The write erase verify command step 706 is repeated for each row of data read and verified. Each byte in the bank is read and verified to be erased 722 (byte value of 255). If a row address is found in the bad address, step 710, or new bad address tables, step 712, the data bytes are still read, but are not verified to be erased. If any byte of any row is not completely erased (each bit to a logic 1 or logic high), the process is repeated. When a maximum number of tries is reached, step 728, an error message is sent to the extractor in step 730.

From the above description of the invention, those skilled in the art will perceive improvements, changes and modifications. Such improvements, changes and modifications within the skill of the art are intended to be covered by the appended claims.

Having described the invention, the following is claimed:

1. A data recorder comprising:
   an interface board having means for connecting said data recorder to a data source, said interface board including a plurality of receiver circuits and a plurality of driver circuits for respectively inputting and outputting data from and to said data source;
   a controller broad operatively connected to said interface board, said controller board including a controller for controlling recording of data from said data source, said controller board further including a temporary memory buffer, a nonvolatile memory, a data bus, an address bus, and a control bus connected to said controller, data first received from said data source being initially stored in said temporary memory buffer by said controller;
   a flash memory board including a plurality of flash memory devices, each of said flash memory devices being divided into a plurality of word rows, each word row of each of said flash memory devices having a row address with corresponding rows of said plurality of said flash memory devices having a same row address, each of said flash memory devices defining a word column, said flash memory board further including flash memory device address decoder means operatively connected to said controller for decoding an address output from said controller for selecting a desired one of said flash memory devices and row address decoder means for addressing a word row in a selected one of said flash memory devices, each of said flash memory devices having an internal state machine that is responsive to a plurality of programming steps output from said controller including write command and write word, each of said internal state machines requiring a minimum predetermined time period to process said programming steps;
   said controller including processor means for (a) providing said write command step to a first of said plurality of said flash memory devices, (b) providing said write command step to a second of said plurality of flash memory devices while said write command step is being process by said first of said plurality of said flash memory devices, (c) addressing a first of said word rows of said first of said plurality of flash memory devices and providing a first data word for recording in said first word row of said first of said plurality of flash memory devices while said write command step is being process by said second of said plurality of said flash memory devices, and (d) addressing a first of said word rows of said second of said plurality of flash memory devices and providing a second data word for recording in said first word row of said second of said plurality of said flash memory devices while said first data word is being processed by said first of said plurality of said flash memory devices.

2. The data recorder of claim 1 wherein each internal state machine of each of said flash memory devices is further responsive to further programming steps including write verify command and read word and wherein said processor means of said controller is further for (e) providing said write verify command to said first of said plurality of said flash memory devices while said second data word is being processed by said second of said plurality of said flash memory devices, (f) providing said write verify command to said second of said plurality of said flash memory devices while said first of said plurality of said flash memory devices is processing said write verify command provided to said first of said plurality of said flash memory devices, (g) reading said first data word written from said first word row of said first of said plurality of said flash memory devices while said second of said plurality of said flash memory devices is processing said write verify command provided to said second of said plurality of said flash memory devices, (h) verifying that said first data word read from said first word row of said first of said plurality of said flash memory devices is equal to said first data word provided for recording, (i) reading said second data word written from said first word row of said second of said plurality of said flash memory devices after said first data word is read and verified, (j) verifying that said second data word read from said first word row of said second of said plurality of said flash memory devices is equal to said second data word provided for recording, and (k) providing an error signal if either said verifying steps indicate that said first or second word provided for recording does not match said first and second word read, respectively.

3. A data recorder comprising:
a plurality of flash memory devices, each of said plurality of said flash memory devices having a plurality of memory word locations capable of storing data in response to a plurality of programming steps applied to said each of said flash memory devices, said programming steps including write command and write word, each of said flash memory devices having an internal state machine requiring a minimum predetermined time period to process said programming steps, each of said flash memory devices being divided into one word column and a plurality of word rows, each word row of each of said flash memory devices having a row address with corresponding word rows of said plurality of said flash memory devices having a same row address;
first means connected to a first of said plurality of said flash memory devices for providing said write command step to said first of said plurality of said flash memory devices;
second means connected to a second of said plurality of said flash memory devices for providing said write command step to said second of said plurality of said flash memory devices while said write command step provided to said first of said plurality of said flash memory devices is being processed;
third means connected to said first of said plurality of said flash memory devices for addressing a first of said word rows of said first of said plurality of flash memory devices and for providing a first data word for recording in said first word row of said first of said plurality of flash memory devices while said write command step provided to said second of said plurality of said flash memory devices is being processed by said second of said plurality of said flash memory devices; and
forth means connected to said second of said plurality of said flash memory devices for addressing a first of said word rows of said second of said plurality of flash memory devices and for providing a second data word for recording in said first word row of said second of said plurality of said flash memory devices while said first data word is being processed by said first of said plurality of said flash memory devices.

4. The data recorder of claim 3 wherein said internal state machine is further responsive to further programming steps including write verify command and read word, said data recorder further comprising:
fifth means connected to said first of said plurality of said flash memory devices for providing said write verify command to said first of said plurality of said flash memory devices while said second data word is being processed by said second of said plurality of said flash memory devices;
sixth means connected to said second of said plurality of said flash memory devices for providing said write verify command to said second of said plurality of said flash memory devices while said write verify command provided to said first of said plurality of said flash memory devices is being processed by said first of said plurality of said flash memory devices;
first reading means connected to said first of said plurality of said flash memory devices for reading said first data word recorded in said first word row of said first of said plurality of said flash memory devices while said write verify command provided to said second of said plurality of said flash memory devices is being processed by said second of said plurality of said flash memory devices;
first verifying means connected to said first reading means for verifying that said first data word read from said first word row of said first of said plurality of said flash memory devices is equal to said first data word provided for recording;
second reading means connected to said second of said plurality of said flash memory devices for reading said second data word recorded in said first word row of said second of said plurality of said flash memory devices after said first data word is read and verified;
second verifying means connected to said second reading means for verifying that said second data word read from said first word row of said second of said plurality of said flash memory devices is equal to said second data word provided for recording; and
seventh means connected to said first and second verifying means for providing an error signal if either of said first means for verifying or said second means for verifying indicate that said first or second word provided for recording does not match said first and second words read, respectively.

5. The data recorder of claim 4 further comprising nonvolatile memory means connected to said seventh means for providing an error signal for storing an address of a word row for which said error signal was provided as a bad address.

6. The data recorder of claim 5 further comprising means for skipping bad addresses stored in said nonvolatile memory means during subsequent recordings.

7. The data recorder of claim 5 including means for erasing data stored in said data recorder, and means for skipping erasing said bad address.

8. A method of programming a plurality of flash memory devices, each of said plurality of said flash memory devices having a plurality of memory word locations capable of storing data in response to a plurality of programming steps applied to each of said plurality of said flash memory devices, said programming steps including write command and write word, each of said flash memory devices having an internal state machine requiring a minimum predetermined time period to process said programming steps, said method comprising the steps of:

dividing each of said plurality of said flash memory devices into one word column and a plurality of word rows;

assigning each word row of each of said plurality of said flash memory devices a row address with corresponding word rows of said plurality of said flash memory devices having a same row address;

providing said write command step to a first of said plurality of said flash memory devices;

providing said write command step to a second of said plurality of said flash memory devices while said write command step provided to said first of said plurality of said flash memory devices is being processed;

addressing a first of said word rows of said first of said plurality of said flash memory devices and providing a first data word for recording in said first word row of said first of said plurality of said flash memory devices while said write command step provided to said second of said plurality of said flash memory devices is being processed; and addressing a first of said word rows of said second of said plurality of said flash memory devices and providing a second data word for recording in said first word row of said second of said plurality of said flash memory devices while said first data word is being processed by said first of said plurality of said flash memory devices.

9. The method of claim 8 wherein each of said flash memory devices are further responsive to additional programming steps for recording data words, said further programming steps including write verify command, and read word, said method further comprising the steps of:

providing said write verify command to said first of said plurality of said flash memory devices while said second data word provided to said second of said plurality of said flash memory devices is being processed by said second of said plurality of said flash memory devices;

providing said write verify command to said second of said plurality of said flash memory devices while said write verify command provided to said first of said plurality of said flash memory devices is being processed;

reading said first data word recorded in said first word row of said first of said plurality of said flash memory devices while said write verify command provided to said second of said plurality of said flash memory devices is being processed by said second of said plurality of said flash memory devices;

verifying that said first data word read from said first word row of said first of said plurality of said flash memory devices is equal to said first data word provided for recording;

reading said second data word recorded in said first word row of said second of said plurality of said flash memory devices after said first data word is read and verified;

verifying that said second data word read from said first word row of said second of said plurality of said flash memory devices is equal to said second data word provided for recording; and providing an error signal if either of said verify steps indicates that either said first and second word read does not match said first and second words provided for recording, respectively.

10. The method of claim 9 further comprising the steps of identifying any memory word locations in which a word written to said any memory word location did not verify with a word read from said any memory word location as a bad row address, storing said identified bad row address in memory, skipping over said identified bad row address during subsequent recordings.

11. The method of claim 10 further including the step of skipping said identified bad row address during data extraction.

12. The method of claim 10 further including the step of skipping said identified bad row address during memory erasing.

13. The method of claim 10 further comprising the steps of dividing a mass storage device into a plurality of banks of memory, each said memory bank including a predetermined number of memory word locations, monitoring a number of said identified bad row addresses in each said memory bank, comparing the number of said identified bad row addresses in each said memory bank against a predetermined bad row address limit, marking a memory bank as bad if the number of said identified bad row addresses within said memory bank exceeds said predetermined bad row address limit, and skipping said marked memory bank during subsequent recordings.

14. The method of claim 13 further including the step of skipping said marked bad memory bank upon data extraction.

15. The method of claim 13 further including the step of skipping said marked bad memory bank upon memory erasing.

* * * * *

UNITED STATES PATENT AND TRADEMARK OFFICE
CERTIFICATE OF CORRECTION

PATENT NO. : 5,295,255
DATED : March 15, 1994
INVENTOR(S) : Kenneth A. Malecek, Timothy F. Powell, and Jeffrey A. Dobos It is certified that error appears in the above-indentified patent and that said Letters Patent is hereby corrected as shown below:

Column 16, line 7, change "broad" to --board--.

Signed and Sealed this

Twenty-second Day of August, 1995

Attest:

BRUCE LEHMAN

Attesting Officer

Commissioner of Patents and Trademarks